(12) United States Patent
Akimoto

(10) Patent No.: US 6,189,481 B1
(45) Date of Patent: Feb. 20, 2001

(54) MICROWAVE PLASMA PROCESSING APPARATUS

(75) Inventor: Takeshi Akimoto, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 08/355,009

(22) Filed: Dec. 13, 1994

(30) Foreign Application Priority Data

Dec. 14, 1993 (JP) .................................................. 5-312418

(51) Int. Cl.⁷ .................................................. C23C 16/00
(52) U.S. Cl. .......................... 118/723 MW; 118/723 MP; 204/298.38
(58) Field of Search .................. 118/723 MP, 723 E, 118/723 MW, 723 ME, 723 MR, 723 MA; 156/345; 204/298.11, 298.38

(56) References Cited

U.S. PATENT DOCUMENTS

| | | | |
|---|---|---|---|
| 3,573,190 | * | 3/1971 | Bloom .............................. 204/298.11 |
| 4,102,768 | * | 7/1978 | Kearin .............................. 204/192 P |
| 4,278,528 | * | 7/1981 | Kuehnle .............................. 204/298 |
| 4,893,584 | * | 1/1990 | Doehler et al. . |
| 4,985,109 | * | 1/1991 | Otsubo .............................. 156/345 |
| 5,074,985 | * | 12/1991 | Tamura .............................. 204/298.11 |
| 5,130,170 | * | 7/1992 | Kanai et al. . |

FOREIGN PATENT DOCUMENTS

| | | | |
|---|---|---|---|
| 62-122217 | * | 6/1987 | (JP) . |
| 4-84426 | * | 3/1992 | (JP) . |
| 5-3734 | * | 1/1993 | (JP) . |

* cited by examiner

*Primary Examiner*—Matthew Smith
*Assistant Examiner*—Robert A Hullinger
(74) *Attorney, Agent, or Firm*—Sughrue, Mion, Zinn, Macpeak & Seas, PLLC

(57) ABSTRACT

A microwave plasma processing apparatus for producing plasma from processing gas by a microwave and processing a wafer or similar semiconductor by the plasma. The apparatus includes a mechanism which allows the areas of radiation ports formed in an upper electrode to be changed independently of each other. This allows a plasma distribution in a plasma processing chamber to be controlled in any desired manner.

3 Claims, 4 Drawing Sheets

MICROWAVE PLASMA PROCESSING APPARATUS

BACKGROUND OF THE INVENTION

The present invention relates to a microwave plasma processing apparatus for producing plasma from processing gas by a microwave and processing a wafer or similar semiconductor substrate by the plasma.

In the semiconductor devices art, plasma processing technologies are extensively used for treating wafers or similar semiconductor substrates accurately. Among them, a microwave plasma processing apparatus using a microwave implements an inherently high plasma density and reduces processing time. Japanese Patent Publication No. 5-3734, for example, proposes an apparatus of the type having a waveguide and a plasma processing chamber. A microwave propagated through the waveguide is emitted into the plasma processing chamber in which a wafer or similar semiconductor substrate is positioned, thereby generating plasma in the chamber. Specifically, the microwave is radiated into the chamber on the basis of a microwave distribution which is set up in the waveguide and can be readily estimated by computation. Ideally, the plasma density distribution conforms to the microwave distribution emitted into the chamber. A method of controlling the microwave distribution in the waveguide is taught in, for example, Japanese Patent Laid-Open Publication Nos. 62-122217 and 4-84426.

The method taught in the above Laid-Open Publication No. 62-122217 chances or controls the microwave distribution in the waveguide by inserting a plurality of variable tuner rods into the waveguide. The method disclosed in the other Laid-Open Publication No. 4-84426 controls the microwave distribution by moving a variable deflection plate disposed in the waveguide. In any case, it has been customary to control the plasma distribution indirectly through the control over the microwave distribution in the waveguide.

However, controlling the plasma distribution through the control over the microwave distribution in the waveguide is not a direct implementation. With this kind of method, it is difficult to control the plasma distribution in a desired manner. Specifically, the plasma distribution in the processing chamber is determined by the distribution of microwave radiation which is, in turn, determined by the interaction of the microwave and the gas or gas plasma in the chamber. Stated another way, the plasma distribution depends on the gas to be used. Therefore, it is extremely difficult to control the plasma distribution only through the control over the microwave distribution in the waveguide.

SUMMARY OF THE INVENTION

It is, therefore, an object of the present invention to provide a microwave plasma processing apparatus capable of controlling a plasma distribution in a plasma processing chamber in a desired manner.

In accordance with the present invention, a microwave plasma processing apparatus for producing plasma from processing gas by a microwave and processing an object by the plasma has a housing defining a processing chamber for accommodating the object, a first flat electrode disposed in the processing chamber to be loaded with the object, a second flat electrode parallel to the first flat electrode and formed with a plurality of radiation ports for radiating a microwave into the processing chamber, and a mechanism for changing the respective areas of the plurality of radiation ports of the second electrode.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1A:
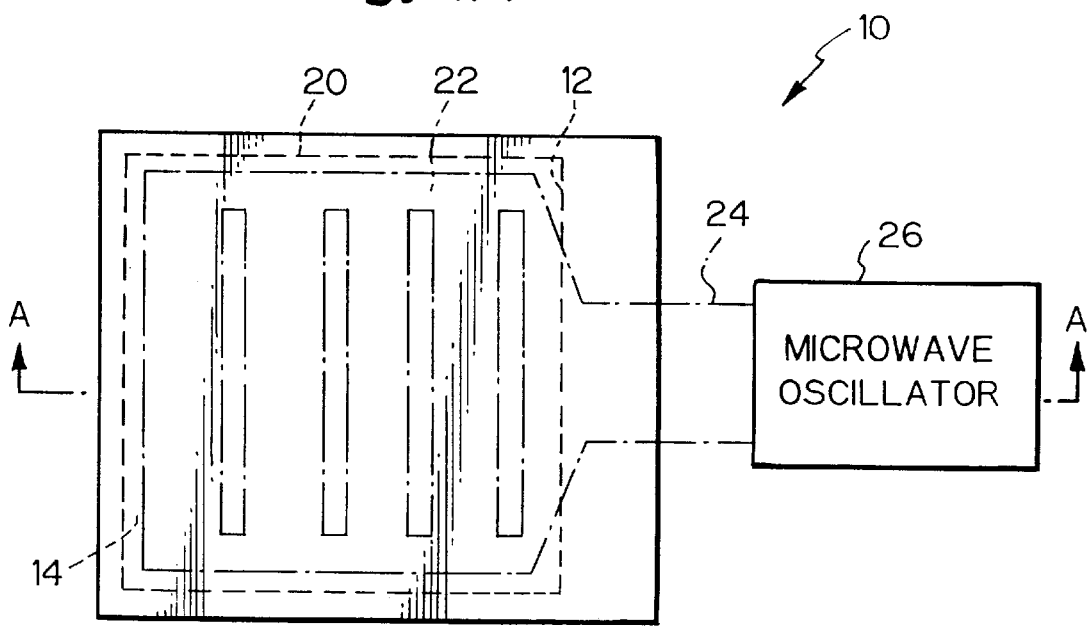
FIG. 1A is a plan view of a conventional microwave plasma processing apparatus.
Figure 1B:
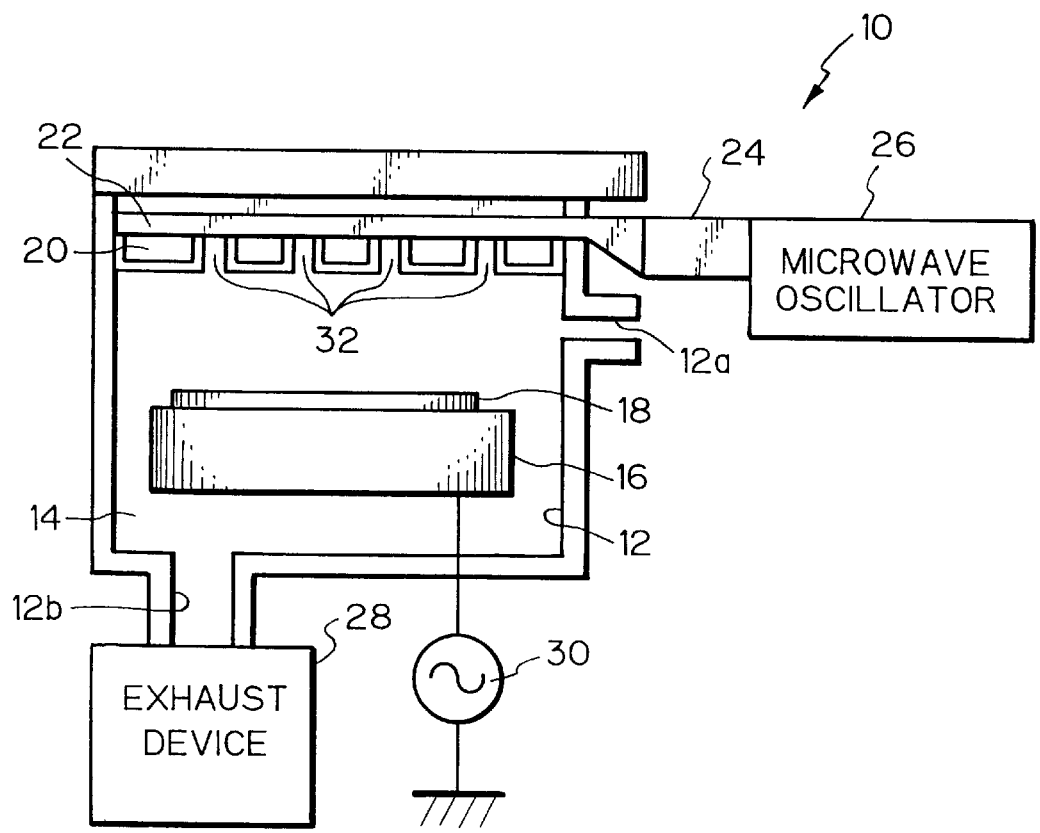
FIG. 1B is a section along line A—A of FIG. 1.
Figure 1C:
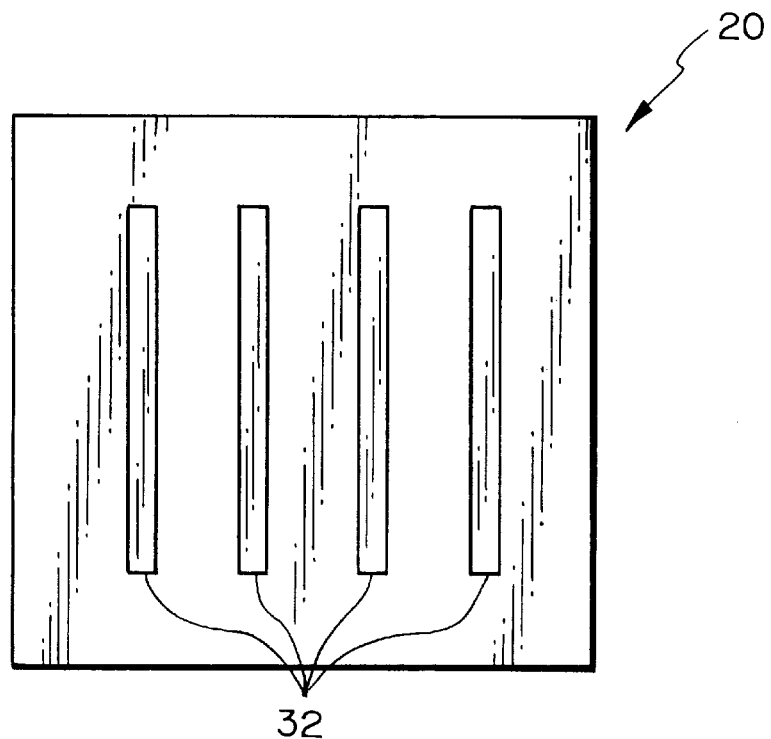
FIG. 1C is a plan view of an upper electrode included in the conventional apparatus.

To better understand the present invention, a brief reference will be made to a conventional microwave plasma processing apparatus, shown in FIGS. 1A–1C. As shown, the apparatus, generally 10, has a housing 12 defining a plasma processing chamber or etching chamber 14 therein. A table 16 is disposed in the chamber 14 and loaded with a wafer or similar semiconductor substrate 18. The table 16 plays the role of a lower electrode. An upper electrode 20 is located above and in parallel to the lower electrode 16 and formed with radiation ports 32. A dielectric path 22 is provided on the top of the upper electrode 20 and implemented by Teflon. A waveguide 24 connects the dielectric path 22 to a microwave oscillator 26. In this configuration, a microwave from the oscillator 26 is propagated through the waveguide 22 to the dielectric path 22. The casing 12 is formed with a gas inlet 12a and a gas outlet 12b while an exhaust device 28 is communicated to the gas outlet 12b. A high frequency power source 30 is connected to the lower electrode or table 16.

In operation, a microwave from the microwave oscillator 26 is guided by the waveguide 24 into the dielectric path 22. In the dielectric path 22, the microwave spreads transversely with respect to the direction of propagation. At this instant, the transverse field strength is uniform, and a standing wave is produced in the direction of propagation. The microwave in the dielectric path 22 is emitted into the etching chamber 14 via the radiation ports 32 of the upper electrode 20, thereby generating plasma in the chamber 14. In this manner, the microwave is radiated into the chamber 14 while spreading substantially uniformly in the dielectric path 22, so that plasma can be generated over a broad area. The plasma is accelerated toward the substrate 18 on the table 16 by an electric field generated by the high frequency power source 30.

Figure 2:
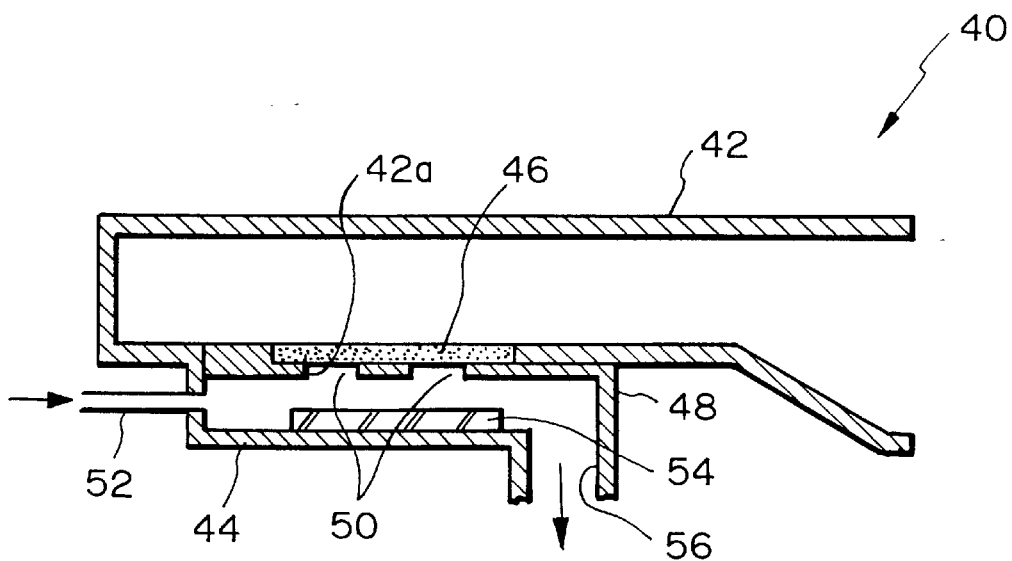
FIG. 2 is a section showing another conventional microwave plasma processing apparatus.

Another conventional microwave plasma processing apparatus, which is taught in previously mentioned Japanese Patent Publication No. 5-3734, will be described with reference to FIG. 2. As shown, the apparatus, generally 40, has a waveguide 42 and a plasma processing chamber 44. The waveguide 42 is formed with a window 42a in a direction perpendicular to the electric field of a microwave propagating through the waveguide 42. An alumina plate 46 is received in the window 42a and held by a holder 48 in order to seal the chamber 44. The holder 48 is formed with radiation ports 50 for radiating the microwave into the chamber 44. Processing gas is admitted into the chamber 44 via a gas inlet 52. In this condition, the microwave generates plasma in the chamber 44. The plasma is applied to a wafer 54 disposed in the chamber 44 so as to process it. The reference numeral 56 designates a gas outlet.

The conventional apparatuses described above control the plasma in the processing chamber by changing the microwave distribution in the waveguide, as stated earlier. However, controlling the plasma distribution through the control over the microwave distribution in the waveguide is not a direct implementation. With this kind of scheme, it is difficult to control the plasma distribution in a desired manner. Specifically, the plasma distribution in the processing chamber is determined by the distribution of microwave radiations which is, in turn, determined by the interaction of the microwave and the gas or gas plasma in the chamber. Stated another way, the plasma distribution depends on the gas to be used. Therefore, it is extremely difficult to control the plasma distribution only through the control over the microwave distribution in the waveguide.

Figure 3A:
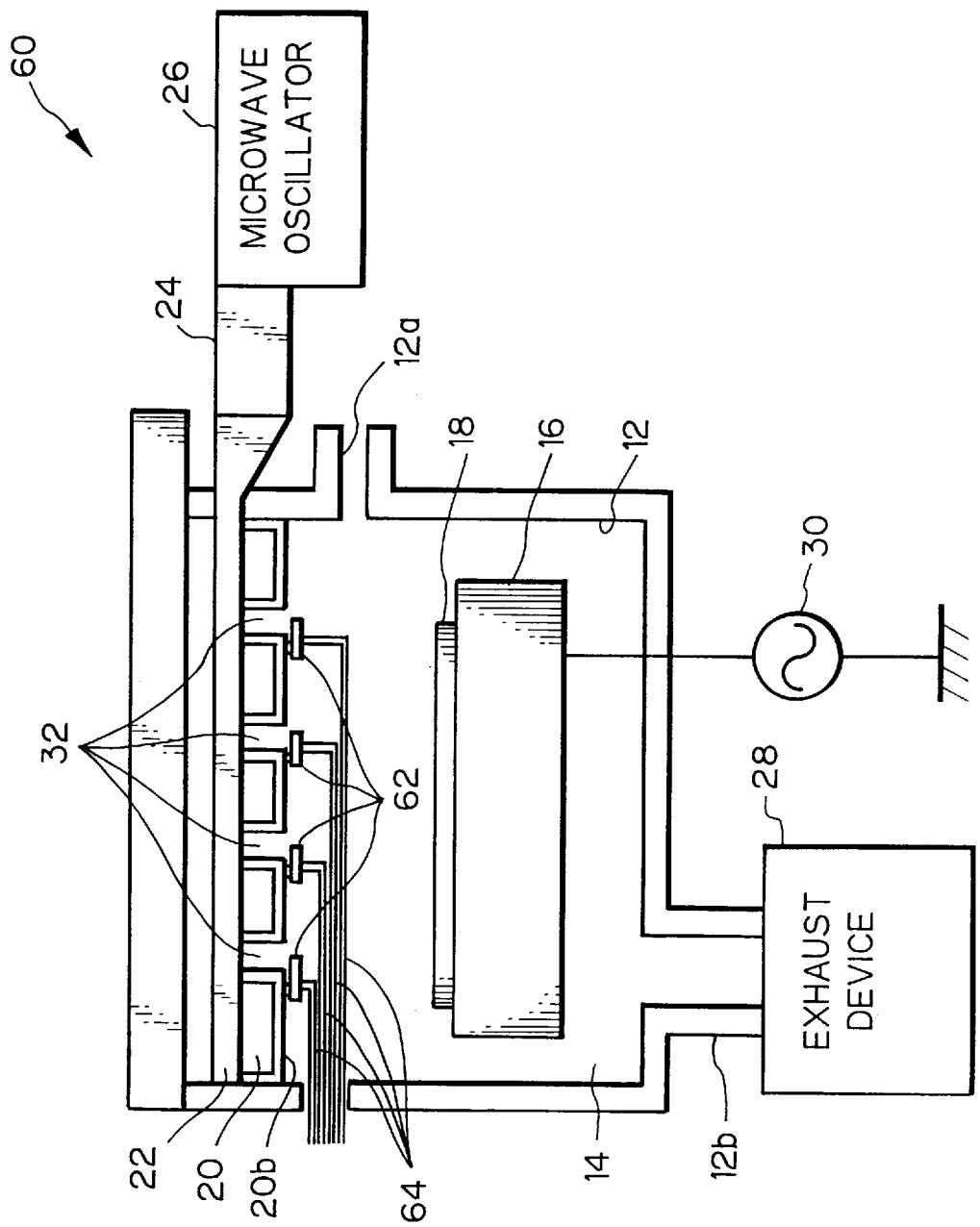
FIG. 3A is a section of a microwave plasma processing apparatus embodying the present invention.
Figure 3B:
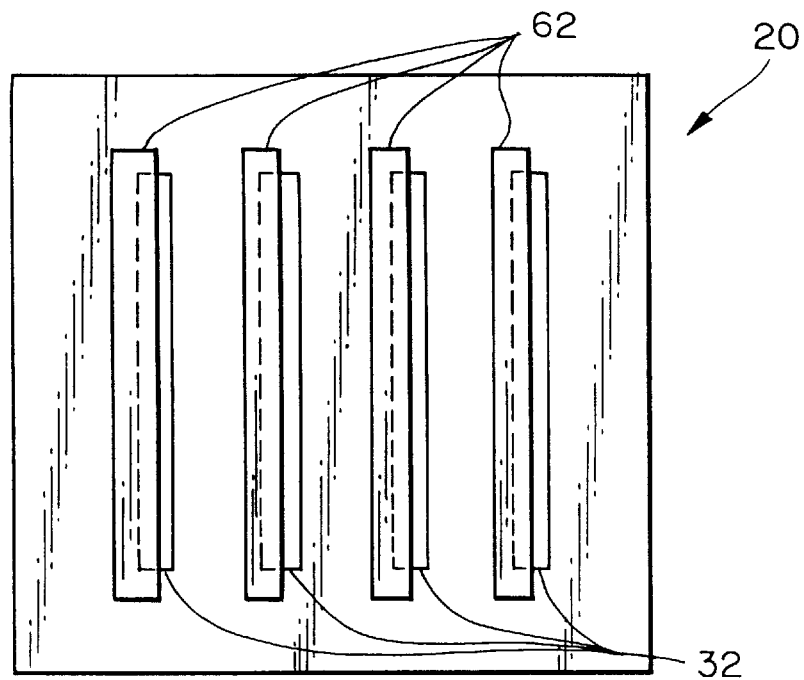
FIG. 3B is a plan view of an upper electrode included in the embodiment.

Referring to FIGS. 3A and 3B, a microwave plasma processing apparatus embodying the present invention is shown which is free from the problem discussed above. The embodiment is similar in basic construction to the conventional apparatus shown in FIGS. 1A–1C and will have the constituents thereof similar to those of the conventional apparatus designated by the same reference numerals. As shown, the apparatus, generally 60 has a housing 12 defining a plasma processing chamber or etching chamber 14 therein. A table or lower electrode 16 is located in the chamber 14 while an upper electrode 20 is disposed above and in parallel to the lower electrode 16. The upper electrode 20 is provided with alumite 20b and formed with radiation ports 32. A dielectric path 22 is provided on the top of the upper electrode 20 and made of Teflon. A microwave from a microwave oscillator 26 is propagated through a waveguide 24 into the dielectric path 22. In the dielectric path 22, the microwave spreads transversely with respect to the direction or propagation. At this instant, the transverse field strength is uniform, and a standing wave is generated in the direction of propagation. The microwave is radiated into the etching chamber 14 via the radiation ports 32 of the upper electrode 20.

In the illustrative embodiment, the upper electrode 20 has four radiation ports or slots 32 by way of example. The slots 32 are each selectively opened or closed by a respective shutter 62. Operating members 64 are respectively connected to the shutters 62. In this configuration, the shutters 62, i.e., the areas of the radiation ports 32 can be controlled at the outside of the chamber 12 independently of each other. For example, assume that a wafer or similar semiconductor substrate 18 should have the central part thereof treated to a greater degree than the peripheral part. Then, the radiation ports 32 facing the central part of the substrate 18 will be opened wider than the other radiation ports 32 facing the peripheral part.

Figure 4:
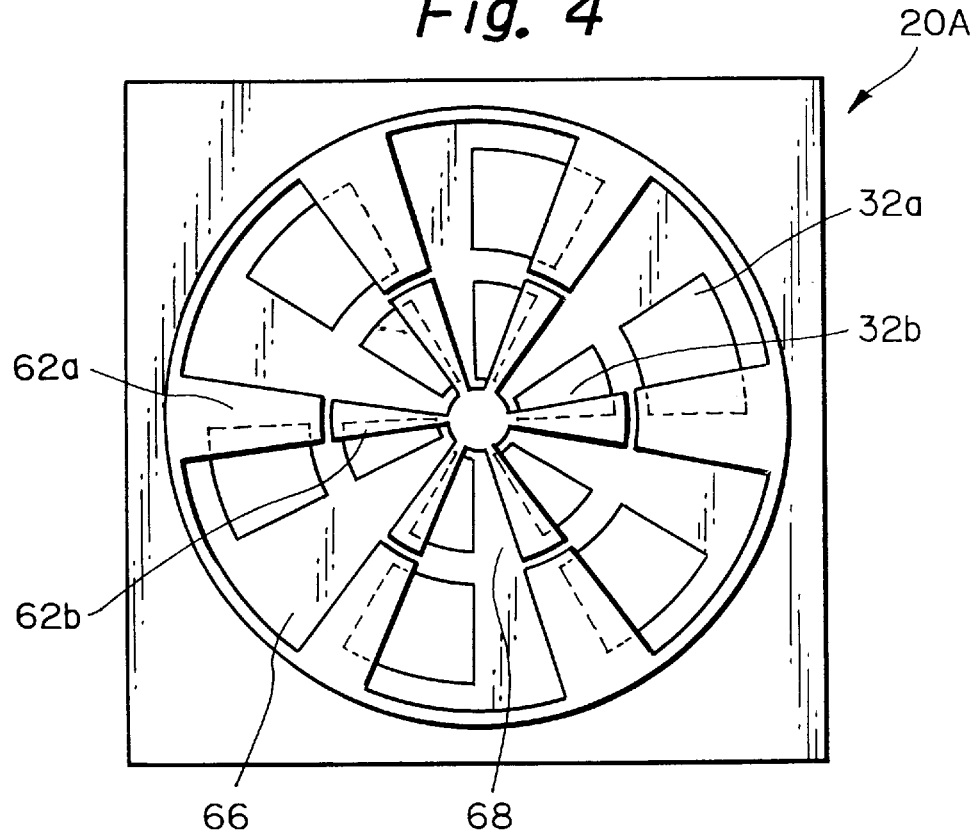
FIG. 4 is a section showing a modified form of the upper electrode included in the embodiment.

FIG. 4 shows a modified form of the upper electrode 20. As shown, the modified upper electrode 20A is formed with two concentric groups of radiation ports, i.e., a group of outer radiation ports 32a and a group of inner radiation ports 32b which are radially aligned with each other and symmetrical with respect to the center of the electrode 20A. While the electrode 20A is shown as having two groups of radiation ports 32a and 32b, three or more concentric groups of radiation ports may be formed in a uniform distribution. Shutters 62a and 62b having openings 66 and 68, respectively, cover the radiation surface of the electrode 20A. The shutters 62a and 62b are respectively associated with the outer radiation ports 32a and inner radiation ports 32b, and each is rotatable about a center shaft, not shown. The shutters 62a and 62b are rotatable independently of each other in order to vary the areas of the respective radiation ports 32a and 32b.

In summary, it will be seen that the present invention provides a microwave plasma processing apparatus capable of controlling a plasma distribution in a plasma processing chamber in any desired manner. This unprecedented advantage is derived from a mechanism which allows the areas of radiation ports formed in an upper electrode to be changed independently of each other.

Various modifications will become possible for those skilled in the art after receiving the teachings of the present disclosure without departing from the scope thereof.

What is claimed is:

1. A microwave plasma processing apparatus for producing plasma from processing gas by a microwave and processing an object by said plasma, said apparatus comprising:

a housing defining a processing chamber for accommodating the object;

a first flat electrode disposed in said processing chamber to be loaded with the object;

a second flat electrode parallel to said first flat electrode and formed with a plurality of radiation ports for radiating a microwave into said processing chamber; and means for changing respective areas of said plurality of radiation ports of said second electrode, wherein said means for changing comprises:

a plurality of shutters; and a plurality of operating members for independently controlling respective positions of said plurality of shutters from outside the processing chamber; and wherein said plurality of radiation ports and said plurality of shutters are arranged in concentric circles around a center of said second electrode, and wherein the shutters arranged in one of the concentric circles are separately operable from the shutters arranged in the other concentric circles.

2. An apparatus as claimed in claim 1, wherein said plurality of radiation ports are radially aligned and symmetric with respect to the center of said second electrode.

3. An apparatus as claimed in claim 1, wherein said plurality of shutters are symmetric with respect to the center of said second electrode.

* * * * *